United States Patent [19]

Noda et al.

[11] Patent Number: 4,571,572
[45] Date of Patent: Feb. 18, 1986

[54] DIGITAL/ANALOGUE CONVERTER

[75] Inventors: Tsutomu Noda; Yoshimi Iso, both of Yokohama; Tetsuo Sato, Takasaki, all of Japan

[73] Assignee: Hitachi, Ltd., Tokyo, Japan

[21] Appl. No.: 715,258

[22] Filed: Mar. 25, 1985

[30] Foreign Application Priority Data

Mar. 28, 1984 [JP] Japan .................................. 59-58231

[51] Int. Cl.⁴ ........................................... H03K 13/02
[52] U.S. Cl. ........................................... 340/347 DA
[58] Field of Search .................. 340/347 DA, 347 NT

[56] References Cited
U.S. PATENT DOCUMENTS
3,918,046 11/1975 Rivers .......................... 340/347 DA

*Primary Examiner*—Vit W. Miska
*Attorney, Agent, or Firm*—Antonelli, Terry & Wands

[57] ABSTRACT

A digital-to-analogue converter for use in a digitally-recorded-signal reproducing apparatus comprises a first constant current source, a switch for allowing the constant current of the first constant current source to flow therethrough for a period corresponding to the digital data, a second constant current source generating a current flowing in the direction opposite to that of the current generated by the first constant current source, a switch for allowing the current of the second constant current source to flow therethrough for a predetermined constant period, and an integrator, wherein the sum of the first and second constant currents is integrated by the integrator. The analogue signal outputted by the integrator has a center level in the vicinity of the ground potential level.

7 Claims, 14 Drawing Figures

DIGITAL/ANALOGUE CONVERTER

BACKGROUND OF THE INVENTION

1. Field of the Invention

The present invention generally relates to an integration type digital-to-analogue converter (hereinafter also referred to simply as D/A converter) incorporating current supply sources. More particularly, the invention concerns a D/A converter suited for use in a digital-recorded-signal reproducing apparatus having a wide dynamic range for reproducing a signal recorded in a digital form.

2. Description of the Prior Art

In recent years, there are available on the market the apparatuses for recording and/or reproducing audio signals on a digital basis such as digital audio disk players typified by compact disk players (CD players), digital audio tape players (DAT players) and the like.

FIG. 1 of the accompanying drawings shows in a block diagram a typical one of the hitherto known digitally-recorded-signal reproducing apparatus for reproducing a signal recorded in a digital form in the system mentioned above. Referring to FIG. 1, a reference numeral 101 denotes a recording medium for recording signal optically or magnetically (i.e. with the aid of optical or magnetic writing means), a numeral 102 denotes a reproducing or pickup head for reading optically or magnetically the signal recorded on the recording medium 101, a numeral 103 denotes a reproduction amplifier for performing equalization of waveform of electric signal produced by the reproducing head 102 as wall as data-strobe processing in preparation for conversion to digital codes and the like processing, a numeral 104 denotes a digital signal processing circuit for performing deinterleaving, error detection/correction and the like processings, a numeral 105 denotes a current source circuit for digital/analogue (D/A) conversion which supplies a constant current for a time period corresponding to the value of the digital signal produced by the digital signal processing circuit 104, a numeral 106 denotes an integrator for integrating the output current of the current source 105, a numeral 107 denotes a re-sample circuit for sampling the analogue output of the integrator 106 at an appropriate timing after the analogue output has attained an analogue voltage corresponding to the input digital value, a numeral 108 denotes a low-pass filter (or LPF) for eliminating spurious signals possibly making appearance at the sampling period of the re-sample circuit, and finally a reference numeral 109 denotes an output terminal for the reproduced analogue signal representative of the recorded information or data.

Now, description will be focussed on the integration type digital-to-analogue or D/A converter which is constituted by the current source 105 for D/A conversion and integrator 106.

Generally, the integration type D/A converter is so arranged as to integrate the constant current supplied from the current source 105 for a time period determined in dependence on the digital input signal to thereby produce a corresponding analogue output signal.

An arrangement of the integration type D/A converter is shown in a functional block diagram in FIG. 2. A similar arrangement of such D/A converter is disclosed in Japanese Patent Application Publication No. 4116/63. Referring to FIG. 2, a numeral 1 denotes an input terminal for a digital signal, 2 denotes an input terminal for a clock signal, 3 denotes a counter, and 4 denotes a switch for interrupting and conducting a current supplied from a constant current source 5. A numeral 6 denotes a control circuit, 7 denotes an operational amplifier constituting a main part of the integrator, 8 denotes a capacitor, 9 denotes a reset switch for discharging electric charge stored in the capacitor 8, and 10 denotes an output terminal for the analogue output signal of the integrator.

In operation, the reset switch 9 is closed at first to allow the electric charge stored in the capacitor 8 to be discharged. Simultaneously, the digital data signal applied to the input terminal 1 is loaded in the counter 3. Thereafter, the counter 3 is operated in response to the clock signal applied to the clock signal input terminal 2 to thereby cause the switch 4 to be closed for a period corresponding to the digital data loaded in the counter, whereby a current can flow to the capacitor 8 from the constant current source 5. In the mean time, the output voltage produced by the integrator composed of the operational amplifier 7 and the capacitor 8 and appeared at the output terminal 10 increases with a predetermined slope or ramp. Upon opening of the switch 4, the output voltage of the integrator is held at a level of a constant value. Through the operation briefed above, the D/A conversion is realized for obtaining the analogue output voltage corresponding to the input digital data value. In this conjunction, it is noted that the conversion time T can be given by the following expression:

$$T = 2^N \times f_{clk}$$

where N represents the bit number of the D/A converter and $f_{clk}$ represents the clock frequency applied to the counter 3. Accordingly, in order to realize the D/A converter whose bit number N is equal to 16 and whose conversion time is about 10 μS, the following condition has to be satisfied.

$$f_{clk} \approx 6.6 \text{ GHz}$$

The clock frequency of such a large value is difficult to realize in the present state of the integrated circuit technology. It should here be mentioned that with the phrase "conversion time T", it is intended to mean the time required for converting the digital signal of N bits each of which is, for example, logic "1" to a corresponding analogue (voltage) signal.

Another arrangement of the integration type D/A converter of 16 bits which permits the clock frequency of the counter under consideration to be decreased is shown in FIG. 3 of the accompanying drawings. A similar structure of this D/A converter is disclosed in an article entitled "16-Bit IC A-D, D-A converter of Low Distortion Factor for Digital Audio Applications" (Nikkei Electronics, Jan. 18, 1982, p.p. 193–203). Now referring to FIG. 3 in which parts functionally equivalent to those shown in FIG. 1 are denoted by like reference symbols, a numeral 11 denotes a constant current source provided for integration of the eight higher order bits of the input digital data, 12 denotes a constant current source provided for integration of the lower order eight bits, 13 denotes a switch for selectively intercepting and conducting a current from the constant current source 11 provided for the upper order eight bits, 14 denotes a switch for selectively intercepting and conducting a current from the constant current source 12 provided for the lower order eight bits, 15 denotes a counter for determining the period during which the switch 13 provided in connection with the integration of upper order bits eight is turned on, 16 denotes a counter for determining the period during which the switch 14 for integration of the lower order eight bits is closed, 17 denotes a control circuit for determining the timings at which the counters 15 and 16 and the switch 9 are controlled, 18 denotes an input terminal for the signal of digital data containing the upper order eight bits, 19 denotes an input terminal for the signal of digital data containing the lower order eight bits, and a numeral 20 denotes an input terminal for a clock signal.

FIG. 4 shows a timing diagram for illustrating operation of the integration type D/A converter shown in FIG. 3. In FIG. 4, a curve 21 represents waveform of the analogue output signal of the integrator, a numeral 22 designates the conducting period of the discharging or reset switch 9, a numeral 23 designates the conducting period of the switch 13 for the upper order eight bits, 24 designates the conducting period of the switch 14 for the lower order eight bits, and 25 designates the period in which the analogue signal resulting from the D/A conversion is outputted.

More specifically, in operation of the integration type D/A converter shown in FIG. 3, the switch 9 is closed at the beginning of the conducting period 22 to thereby discharge electric charge stored in the capacitor 8. At the same time, digital data of 16 bits is divided into upper and lower order bit strings each consisting of eight bits which are loaded in the counters 15 and 16 by way of the input terminals 18 and 19, respectively. Subsequently, the switches 13 and 14 are turned on (i.e. made conductive) for the periods corresponding to the data placed in the counters 15 and 16, respectively. The values of the constant currents supplied from the constant current sources 11 and 18 for the upper order eight bits and the lower order eight bits, respectively, are weighted at the ratio of $2^8$ to 1. During the current conducting periods 23 and 24 determined as the function of the data given by the upper order eight bits and the lower order eight bits, respectively, the capacitor 8 is charged with the currents supplied from the constant current sources 11 and 12, respectively, to thereby produce the waveform 21 at the analogue output 10 of the integrator. The analogue signal thus making appearance at the analogue output terminal 10 represents the analogue value resulting from the D/A conversion of the input digital data and is supplied to a succeeding stage during the output period 25.

By providing two constant current sources for upper order eight bits and lower order eight bits, respectively, of the digital data consisting of 16 bits and weighting the currents thereof at the ratio mentioned above, the clock frequency $f'_{clk}$ for the counters can be decreased to a practically realizable value as follows:

$$f_{clk} = \frac{2^8}{10 \,\mu S} \approx 25 \text{ MHz}$$

However, in either of the integration type D/A converters shown in FIGS. 2 and 3, the voltage waveform of the signal at the output terminal 10 of the integrator includes only positive signal swings relative to the ground potential level to which the non-inverting input terminal of the operational amplifier 7 of the integrator is coupled, as will be seen in FIG. 4. In other words, swings or changes of output voltage signal of the integrator is confined within a range defined between the ground potential level and a certain positive value or level.

However, in consideration of the facts that the center level of the A.C. signals such as audio signal or the like in general is at the ground potential, that the source voltage of the operational amplifier contains two components which equal to each other in the absolute value but have opposite polarities, it is desirable that the output voltage signal of the integrator should swing or vary about the center level which is equal to the ground potential level. In this connection, it may readily occur that the above problem can be solved by setting the non-inverting input level of the operational amplifier 7 lower than the ground potential level. In that case, however, actual implementation of the circuit will encounter another problem in conjunction with the voltages required for operating or driving various circuit elements such as transistors or the like constituting the switches 4, 13 and 14 and the constant current sources 5, 11 and 12, rendering it difficult in practice to lower the non-inverting input level of the operational amplifier 7 of the integrator than the ground potential level.

For this reason, the circuit arrangement disclosed in the article "16-Bit IC A-D, D-A Converter of Low Distortion Factor for Digital Audio Application" cited hereinbefore is made such that the audio signal produced at the output of the integrator is taken out as a voltage signal varying or swinging within a range between the ground potential level and given positive level and subsequently added with an offset voltage so that the ground potential level constitutes the center level of the audio signal.

In the case of the arrangement mentioned above, however, performance or processing capability of the operational amplifier constituting the integrator can not be utilized effectively and fully. More specifically, since the output signal of the integrator finds itself only in the positive voltage region, the output voltage of the operational amplifier is reduced to a half of the maximum voltage which can pass through the operational amplifier. In other words, the dynamic range of the analogue signal produced by the D/A converter is undesirably narrowed to a serious disadvantage.

As an attempt to mitigate the reduction of the dynamic range, there has been proposed a D/A converter of such a structure in which the capacitor 8 is charged externally during the period in which the reset switch 9 shown in FIGS. 2 and 3 is closed, i.e. during the conducting period 22 illustrated in FIG. 4 to such extent that the output level of the operational amplifier 7 of the integrator becomes lower than the ground potential level, which is followed by the integrating operation of the current(s) supplied from the constant current source 5 or sources 11 and 12. A circuit arrangement of this D/A converter is shown in FIG. 5 of the accompanying drawings, in which parts or elements equivalent to those shown in FIGS. 1 to 4 are denoted by like reference numerals. A similar circuit arrangement is disclosed in an article entitled "Bipolar LSI Technologies for Domestic Applications Aiming at Miniaturized Chip of High Speed and High Integration Density", (Nikkei Electronics, June 20, 1983 p.p. 189-193). Now referring to FIG. 5, an operational amplifier 92 has the output coupled to the inverting input of an operational amplifier 7 by way of a siwtch 91. The comparator 92 has an inverting input coupled to the output of the comparator 92 by way of a switch 92. Further, the non-inverting input terminal of the comparator 92 is connected to a junction between serially connected resistors 93 and 94, the other end of the resistor 93 being coupled to a reference voltage source $V_{REF}$, while the other end of the resistor 94 is connected to the output terminal of the operational amplifier 7. A capacitor 8 is inserted between the inverting input and the output terminals of the operational amplifier 7, as in the case of the D/A converters shown in FIGS. 2 and 3. In operation, it is assumed that the voltage appearing at the output terminal 10 of the integrator is of a positive value during a period corresponding to the analogue signal output period 25 (FIG. 4). In succession to this period, the switch 91 is closed under the control of a control circuit 171 at the beginning of the period corresponding to the conducting period 22 illustrated in FIG. 4. In the initial phase of this period, the voltage applied to the non-inverting input of the operational amplifier 92 is a positive voltage the value of which is determined in accordance with the positive reference voltage $V_{REF}$, the positive output voltage at the output terminal 10 of the integrator and the resistance ratio of the resistors 93 and 94. On the other hand, since the inverting input of the operational amplifier 7 is controlled to be the non-inverting input level thereof, i.e. the ground potential level, the inverting input of the operational amplifier 92 is also at the ground level. Consequently, in the initial phase of this period, a large potential difference makes appearance across the input of the operational amplifier 92, resulting in that the operational amplifier 92 supplies a large current to the capacitor 8 by way of the switch 91 to charge the capacitor 8 at an increased rate, whereby the voltage at the output terminal 10 of the integrator drops rapidly to a negative level. The D/A converter of this type suffers, however, a drawback mentioned below.

Because the capacitor 8 is abruptly supplied with electric charge during the reset period, i.e. the period in which the switch 91 is in the closed state, the instantaneous current becomes excessively large during the reset period particularly when the capacitor 8 is of a great capacity, making thus it difficult to implement the circuit in an IC (integrated circuit) configuration.

Since the amplitude of the analogue signal representing the change in the output voltage of the integrator is equal to a value derived by dividing the product of the currrent values of the constant current sources and the integration time by the value of capacity of the capacitor 8, the constant current value can not be determined independent of the value of the capacitor 8 in the circuit design.

Further, due to parasitic capacitance of the switches 13 and 14, delay will be involved in the switching operation of these switches. In order to evade such delay, limitation is imposed on the minimum current value of the constant current source 12, which thus has to be of a relatively large value. Additionally, since the maximum instantaneous current taking place during the reset period has to be restricted in consideration of the maximum permissible current of the integrated circuit, the value of the capacitor 8 must be correspondingly limited, which in turn means that the current value of the constant current source 11 is limited in dependence on the amplitude of the analogue signal. As the result, the ratio of the current value between the constant current sources 11 and 12 can not be set at freedom, to a disadvantage.

In this way, implementation of the aforementioned D/A converter mentioned above in an IC configuration has little design leeway and may be rendered impracticable in some applications.

SUMMARY OF THE INVENTION

It is therefore an object of the present invention to provide a D/A converter in which the shortcomings of the period art converters described above are overcome.

Another object of the present invention is to provide a D/A converter which enjoys a wide dynamic range.

A further object of the invention is to provide a D/A converter whose maximum instantaneous current during the reset period is restricted to a small value, thus giving a plenty of design leeway, and in which the center level of the analogue signal outputted by the integrator lies in the vicinity of the ground potential level.

In view of the above and other objects which will be apparent as description proceeds, there is provided according to one aspect of the present invention a digital-to-analogue or D/A converter which comprises a first constant current source, a switch for conducting a constant current from the first constant current source for a period determined in dependence on digital data, a second constant current source for generating a current flowing in a direction opposite to that of the current generated by the first constant current source, a switch for conducting the current from the second constant current source for a predetermined constant period, and an integrator, wherein the center level of analogue signal outputted from the integrator is caused to lie in the vicinity of the ground potential level by integrating the sum of the first and second constant currents.

BRIEF DESCRIPTION OF THE DRAWINGS

The above and other objects, features and advantages of the present invention will be apparent from the following detailed description of the preferred embodiments of the invention taken in conjunction with the accompanying drawings, in which.

DESCRIPTION OF THE PREFERRED EMBODIMENTS

Figure 1:
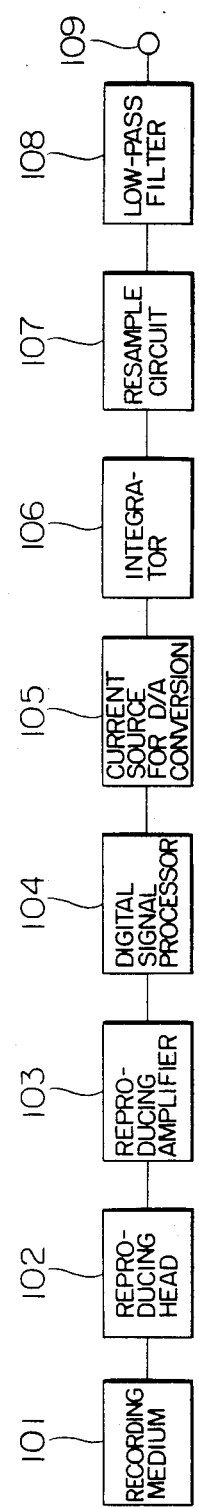
FIG. 1 is a block diagram schematically showing an arrangement of a hitherto known digitally-recorded-signal reproducing apparatus.
Figure 2:
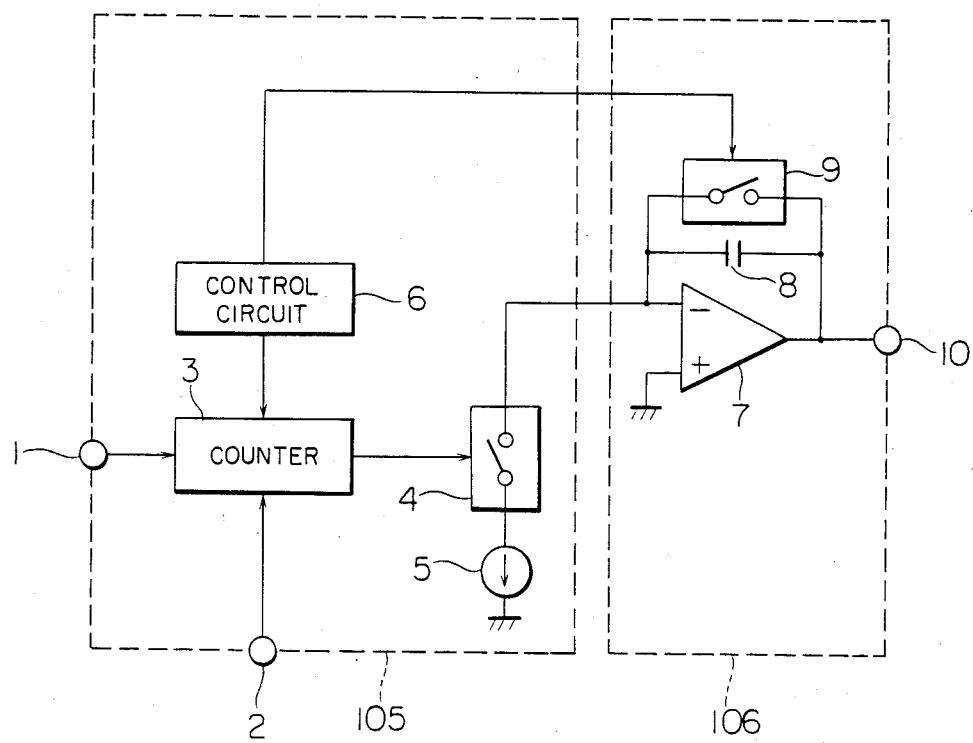
FIG. 2 is a circuit diagram showing a hitherto known integration-type D/A converter.
Figure 6:
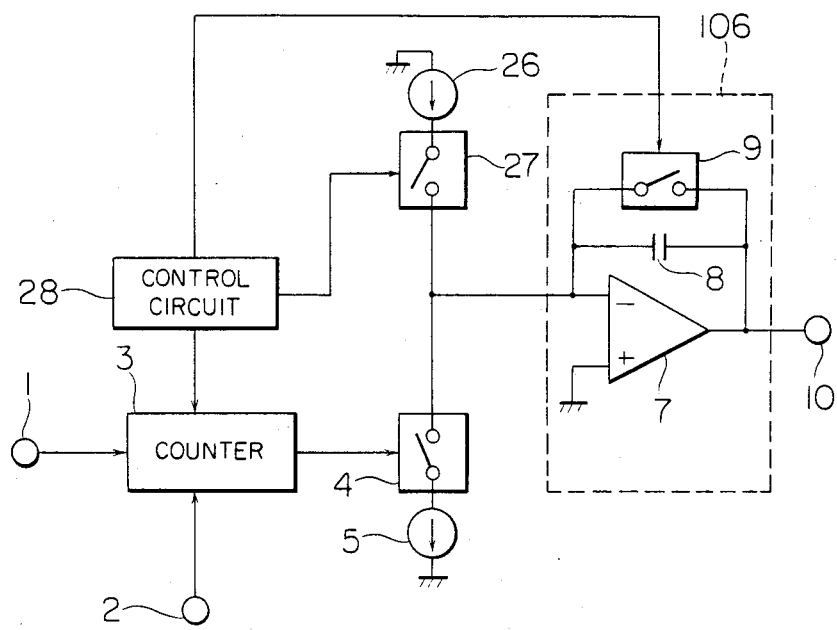
FIG. 6 is a circuit diagram showing an arrangement of an integration-type D/A converter according to an exemplary embodiment of the invention.

Now, the invention will be described in detail firstly in conjunction with a preferred embodiment shown in FIG. 6, in which same or equivalent parts or elements as or to those shown in FIG. 2 are designated by like reference symbols. Referring to FIG. 6, a numeral 26 denotes a constant current source connected in the current flow direction opposite to that of the constant current source 5, a numeral 27 denotes a switch for selectively conducting and blocking a constant current supplied from the constant current source 26, and a numeral 28 denotes a control circuit for controlling operations of the switches 9 and 27 and the counter 3 which controls the switch 4.

The constant current source 26 has one end connected to the ground and the other end connected to the inverting input terminal of the operational amplifier 7 by way of the switch 27.

Figure 7:
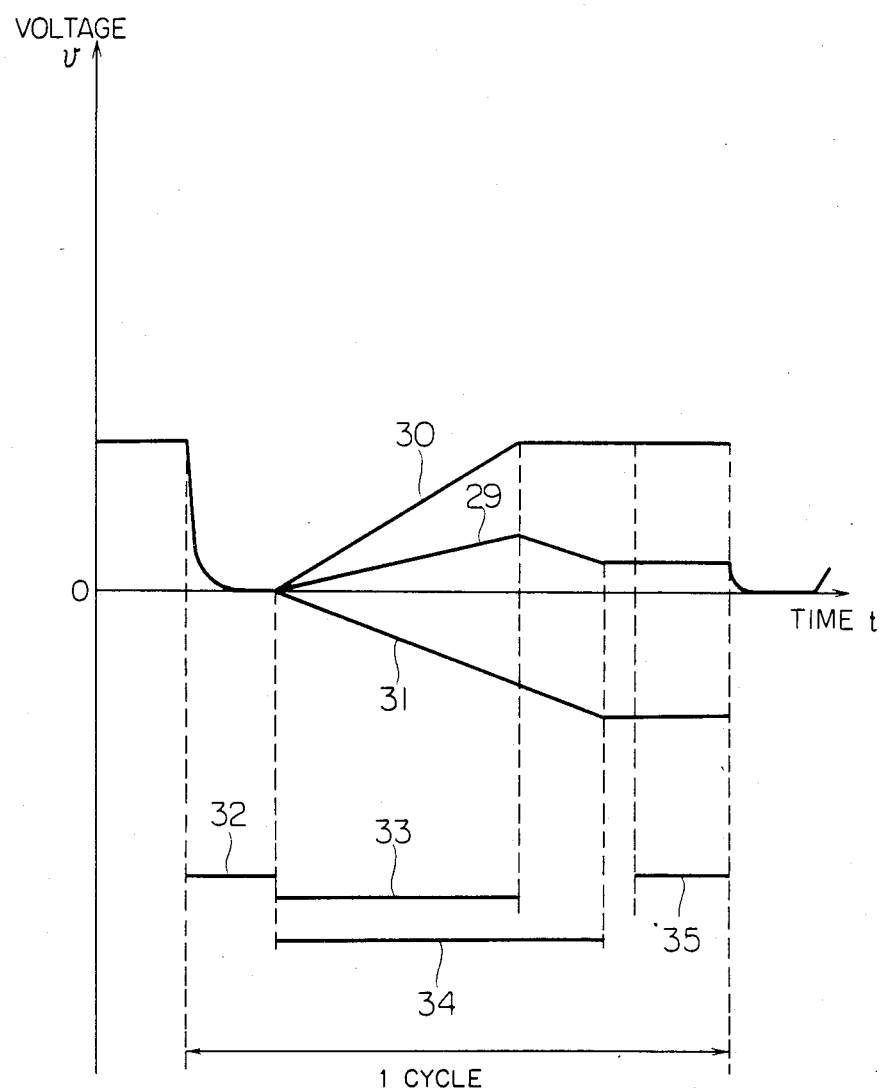
FIGS. 7 and 8 show timing diagrams useful for illustrating operation of the D/A converter shown in FIG. 6.

FIG. 7 shows a timing chart for illustrating operation of the integration-type D/A converter shown in FIG. 6. Referring to FIG. 7, a curve 29 represents an analogue output waveform of the integrator generally denoted by 106 in FIG. 6, a curve 30 represents an analogue output waveform produced by the integrator 106 in the assumed case in which the constant current source 5 is absent, a numeral 32 designates a turn-on or conducting period during which the switch 9 for discharging electric charge from the capacitor 8 is closed or turned on, a numeral 33 designates a conducting period of the switch 4 which period varies in dependence on the digital input data, a numeral 34 designates a conducting or turn-on period of the switch 27, and a numeral 35 designates a period in which the analogue signal resulting from the D/A conversion is outputted. Output voltage of the integrator is taken along the ordinate in FIG. 7, while time is taken along the abscissa.

It should be noted that the analogue waveforms 30 and 31 are depicted merely for convenience of description and the actual analogue output waveform of the integrator 106 is only the one represented by the curve 29.

Figure 8:
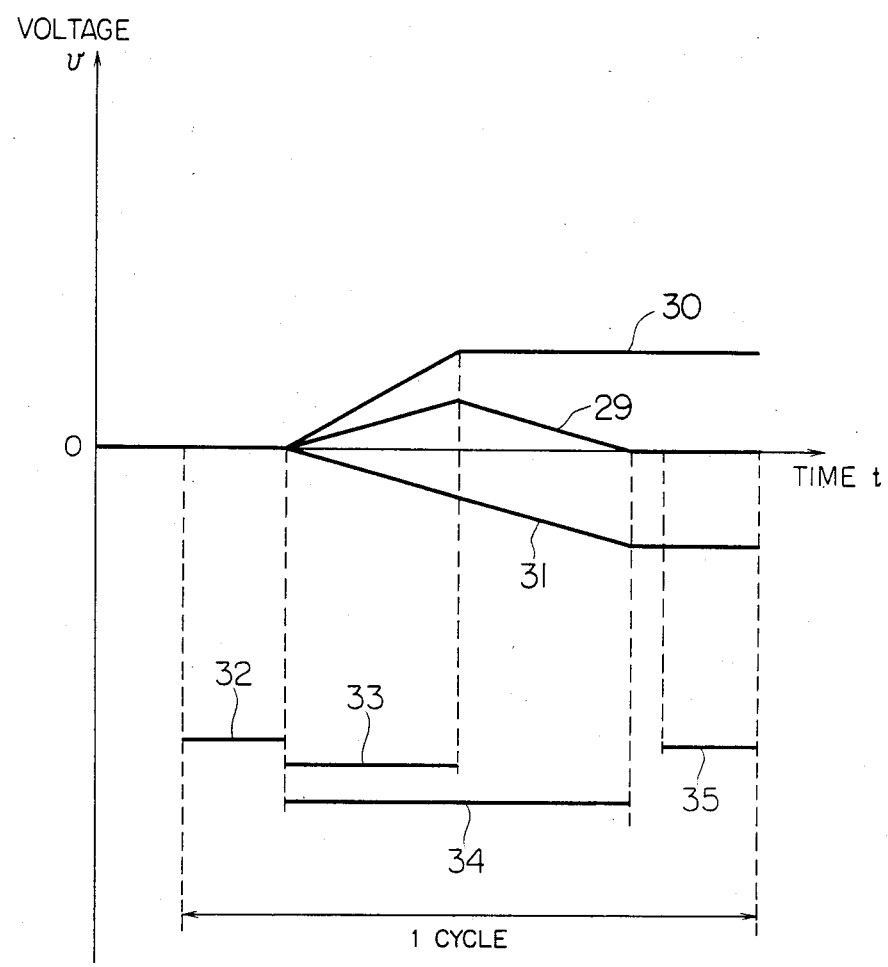

In operation, the switch 9 is closed during the conducting period 32 to cause electric charge stored in the capacitor 8 to be discharged. Simultaneously, the digital data is loaded in the counter 3. Subsequently, when the switch 4 is closed for the conducting period 33 which is determined in dependence on the data placed in the counter 3, the integrator 106 is supplied with a current from the constant current source 5. Then, the output signal appearing at the output terminal 10 of the integrator 106 has to be of the analogue waveform 30. On the other hand, assuming that the switch 27 is closed for a predetermined period under the control of the control circuit 28, the integrator 106 will then be supplied with a current from the constant current source 26. Then, the analogue output signal appearing at the output terminal 10 of the integrator 106 must be of the waveform 31. However, in the actual operation, both the current switches 4 and 27 are simultaneously turned on. Consequently, the output analogue signal appearing at the output terminal 10 of the integrator 106 assumes the analogue waveform 29 which corresponds to the sum resulting from addition of the analogue waveforms 30 and 31. Since the conducting period 34 of the switch 27 is of a constant length determined by the control circuit 28 while the conducting or turn-on period of the current switch 4 is determined in dependence on the digital data placed in the counter 3, it will be seen that the analogue signal 29 varies as a function of the digital data, as in the case of the prior art integration-type D/A converter. In this connection, the current value of the constant current source 26 and the conducting or ON period of the switch 27 may be so set that the analogue signal appearing at the output terminal 10 in response to the input digital data is substantially at the ground level when the input digital data corresponds to an analogue signal having an amplitude equal to a half of the full-scale value. Such setting can be accomplished by a method which will be described below, by way of example only, in conjunction with FIG. 8 in which the output voltage is taken along the ordinate with time t taken along the abscissa. In FIG. 8, reference numerals 29 to 35 designate same items as those designated by those numerals in FIG. 7. As will be seen in FIG. 8, when the conduction or ON period 34 of the switch 27 is set equal to the period or time required for conversion of the data which corresponds to an analogue signal of a full-scale value into the analogue signal, it is possible to make the center level of the analogue output waveform 29 of the integrator coincide with the ground level by selecting the current value of the constant current source 26 to be substantially equal to a half of the current value of the constant current source 5. More specifically, since the absolute value of inclination of the curve 30 during the period 33 is set to be twice as great as that of the curve 31, as is seen in FIG. 7, the waveform 29 which results from synthesization of the waveforms 30 and 31 by making the switch 4 conductive during the period 33 corresponding to a half of the conducting period 34 of the switch 27 is at 0 (zero) volt, i.e. at the ground potential level during the period 35. Accordingly, by employing the integration-type D/A converter according to the instant embodiment of the invention, a digitally-recorded-signal reproducing apparatus can be realized without being accompanied with reduction in the dynamic range or without requiring an excessively large current for charging instantaneously the capacitor 8 during a short period such as the reset period.

Figure 3:
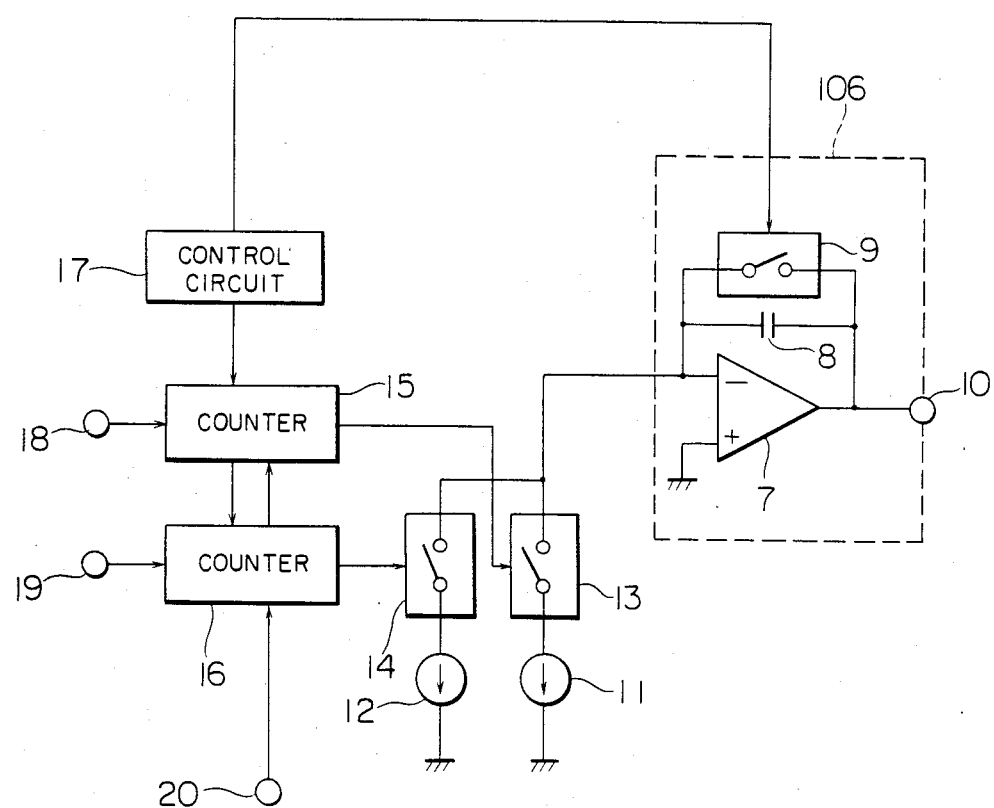
FIG. 3 shows in a circuit diagram showing another hitherto known integration-type D/A converter.
Figure 4:
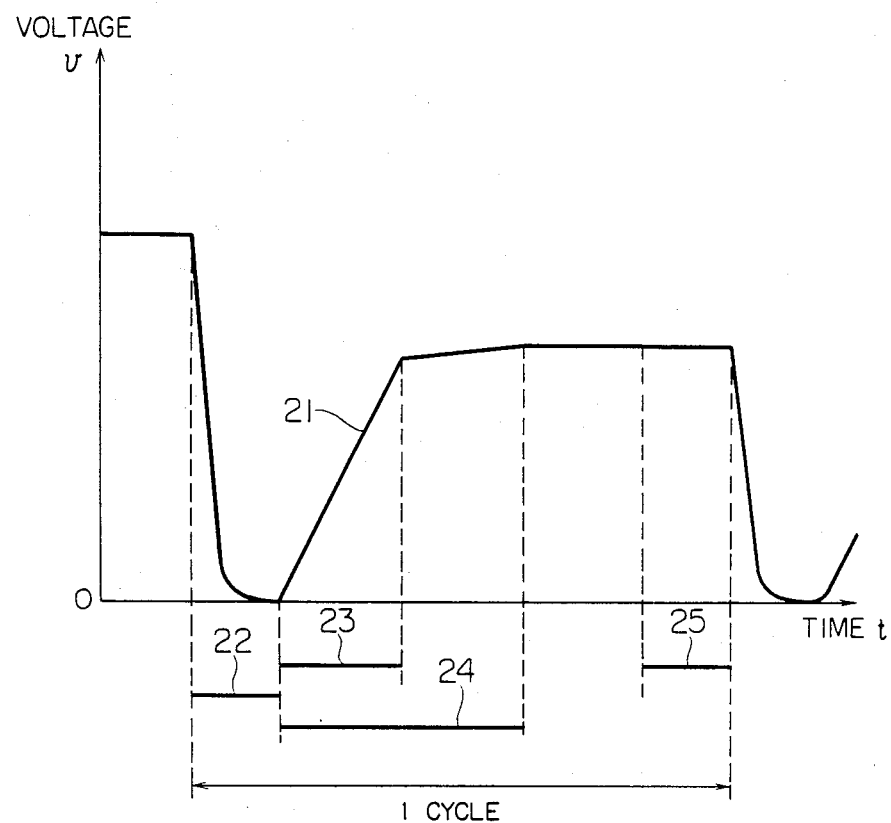
FIG. 4 is a timing diagram useful for illustrating operation of the D/A converter shown in FIG. 3.
Figure 5:
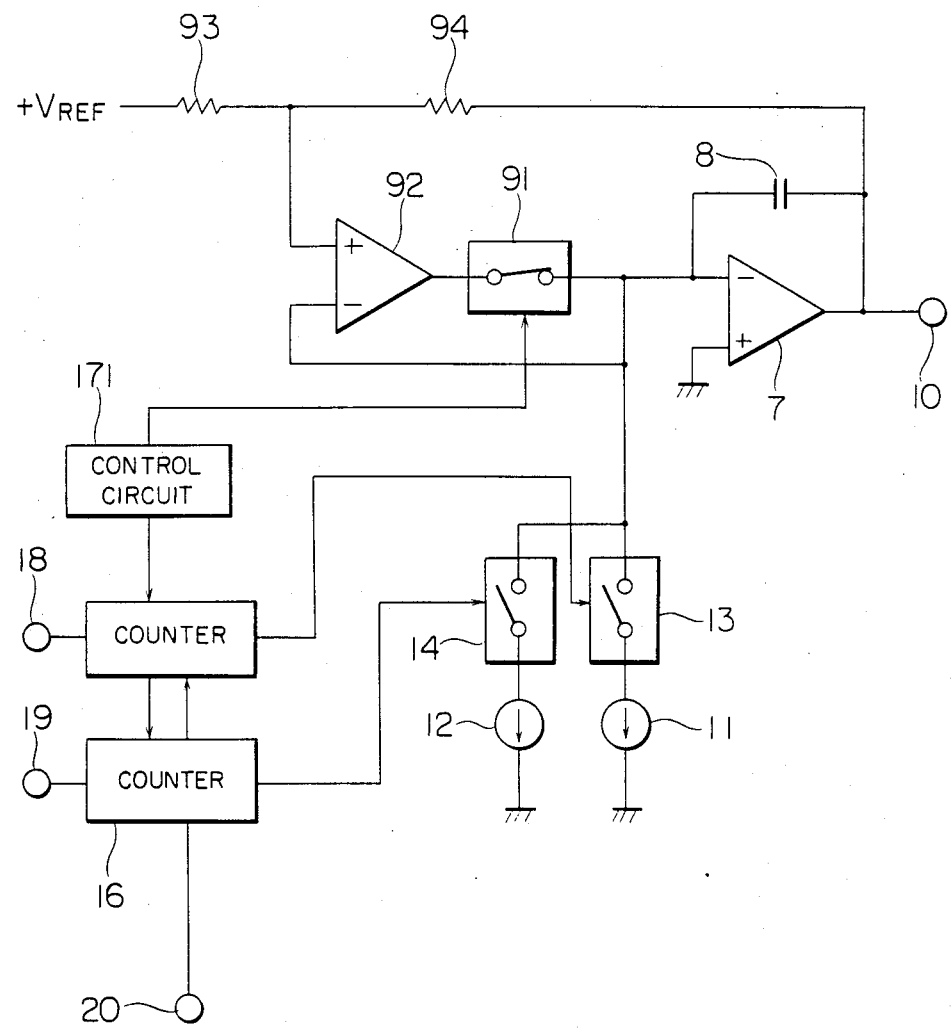
FIG. 5 is a circuit diagram showing a further known integration-type D/A, converter.
Figure 9:
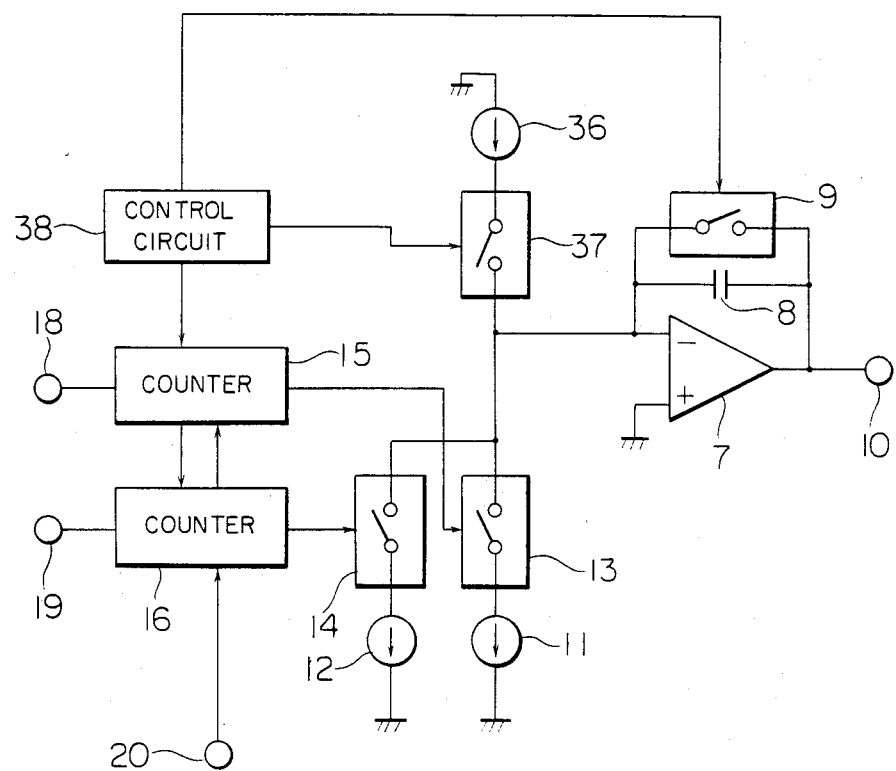
FIG. 9 is a circuit diagram showing a D/A converter according to another embodiment of the invention.
Figure 10:
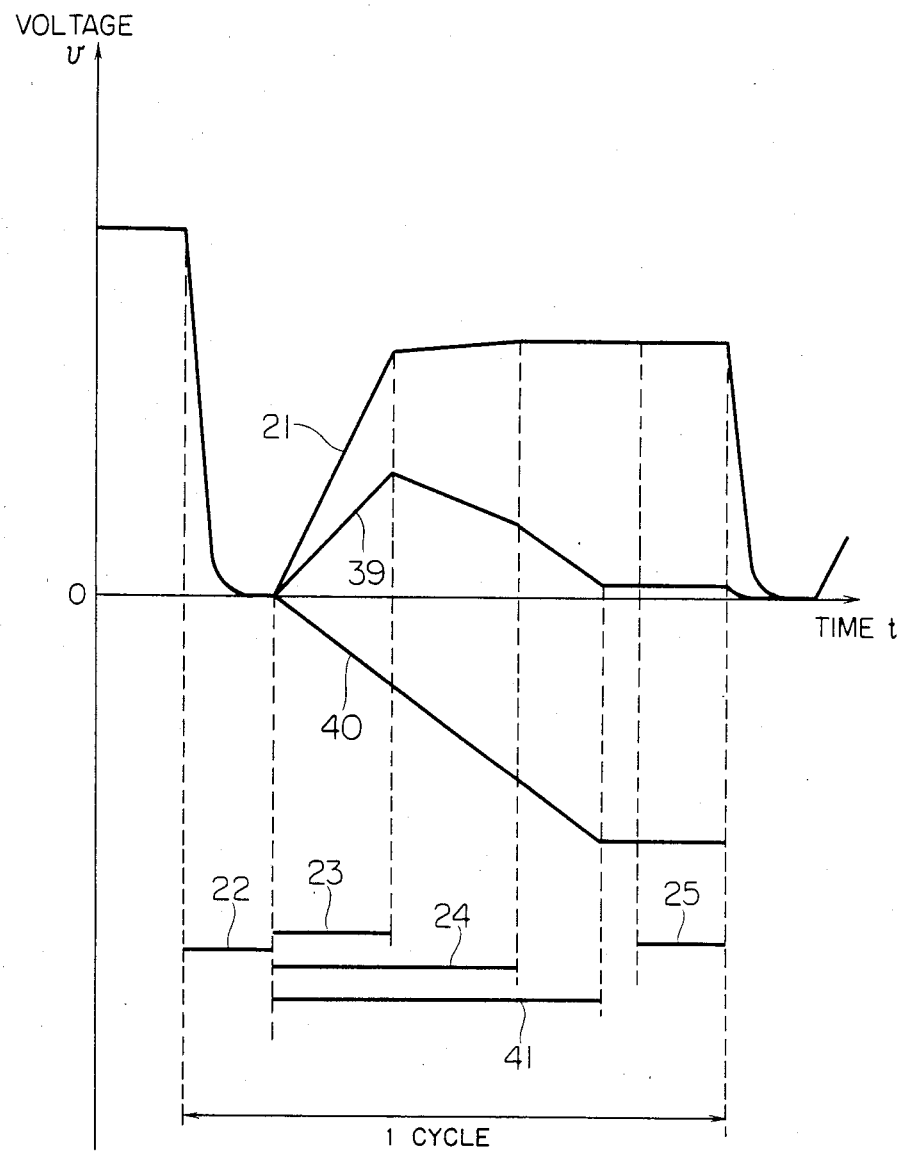
FIG. 10 shows a timing diagram useful for illustrating operation of the D/A converter shown in FIG. 9.

FIG. 9 shows an integration-type D/A converter according to another embodiment of the invention, and FIG. 10 shows a timing diagram for illustrating operation of the D/A converter. In both figures, same parts and items as those shown in FIGS. 3 and 4 are denoted by like reference numerals. In brief, the instant embodiment exemplifies application of the invention to a D/A converter in which the clock frequency for integration is decreased by providing counters 15 and 16 for upper order eight bits and lower order eight bits, respectively, of the input digital data of 16 bits, as described hereinbefore in conjunction with FIG. 3. Now referring to FIG. 9, a reference numeral 36 denotes a constant current source connected for supplying a constant current in the direction opposite to those of the constant current sources 11 and 12 with respect to the capacitor 8, a numeral 37 denotes a switch for connecting and disconnecting the constant current source 36, and a numeral 38 denotes a control circuit for controlling the switches 9 and 37 and the counters 15 and 16. In FIG. 10, a curve 39 represents an analogue output waveform produced at the output 10 of the integrator, 40 represents an analogue waveform produced at the output terminal 10 in the case where the current switches 13 and 14 for the constant current sources 11 and 12, respectively, are not in the conducting state, and a numeral 41 designates a period in which the switch 37 is conducting (i.e. ON). It should here be noted that the analogue waveforms 21 and 40 are depicted merely for convenience of description. Only the waveform 39 represents the actual output of the integrator. The curve 21 represents an analogue waveform corresponding to the digital data, which waveform is produced in the assumed case where the constant current source 36 is absent. This waveform 21 can be derived in the manner described hereinbefore in conjunction with the prior art converter shown in FIGS. 3 and 4. The waveform 40 represents the output of the integrator in the assumed case where the constant current sources 11 and 20 are absent.

In operation, simultaneously with the operation for generating the waveform 21, a current flows to the integrator from the constant current source 36 during the conducting period of the switch 37 (see the curve 40). Consequently, the analogue signal produced at the output 10 of the integrator is the analogue waveform 39 which corresponds to a sum resulting from the addition of the analogue waveforms 21 and 40. As will be seen in FIG. 10, when the waveform 39 resulting from the D/A conversion is transferred to a succeeding stage during the period 25, the value of the analogue waveform 39 corresponds to the value of the waveform 21 shifted downward (in the negative direction) by the value of the waveform 40 at that time point. The waveform 40 is constant independent of the input digital data, while the waveform 21 undergoes change in the value during the period 25 in dependence on the digital data. Consequently, with the circuit arrangement shown in FIG. 9, there can be obtained at the output 10 of the integrator the analogue waveform 39 whose value or level corresponds to the input digital data and is shifted downward (i.e. in the negative direction) by the value or level given by the waveform 40. For setting the analogue output at the ground level in response to the input of digital data which corresponds to the analogue value having an amplitude equal to a half of the full-scale value, the procedure described hereinbefore in conjunction with FIG. 8 may be adopted. More specifically, by setting the conducting period of the switch 37 so as to coincide with the period or time required for converting the data corresponding to an analogue signal having the full-scale value (i.e. by setting the conducting period of the switch 37 twice as long as the period required for converting the digital signal which corresponds to the analogue signal having an amplitude equal to a half of the full-scale value), the center level of the analogue waveform 39 outputted from the integrator can be made to coincide with the ground potential level, provided that the current value of the constant current source 36 approximately equals to a half of that of the constant current source 11 provided for integration of the more significant bits of the digital data among the weighted sources 11 and 12.

Figure 11:
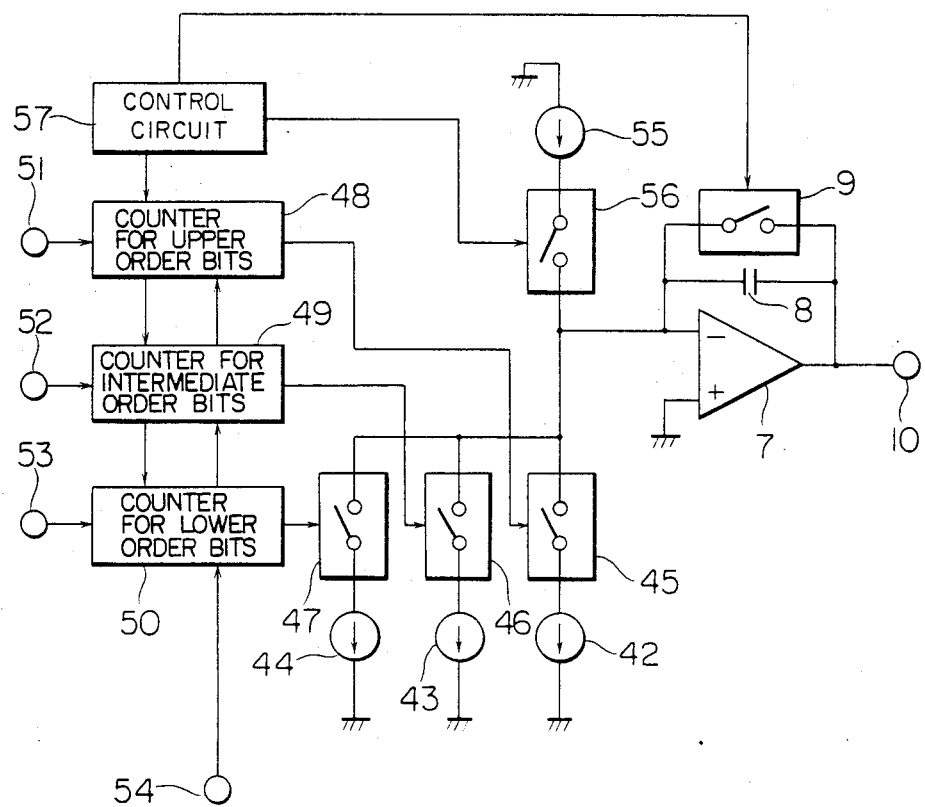
FIG. 11 is a circuit diagram showing still another embodiment of the invention.

FIG. 11 shows an integration-type D/A converter according to yet another embodiment of the invention.

In the case of the instant embodiment, three constant current sources are employed with a view to decreasing further the clock frequency for the integrating operation. More specifically, the constant current sources are provided for upper order six bits, intermediate-order five bits and lower order five bits, respectively, of an input digital data consisting of 16 bits, wherein the three current sources are weighted in terms of the current at the ratio of 1024:32:1 in the order of the bit significance. In more concrete, numeral 42 denotes the constant current source for the upper order bits, 43 denotes the constant current source for the intermediate-order bits, 44 denotes the constant current source for the lower order bits, 45 denotes a switch for selectively conducting and breaking the current of the source for the upper order bits, 46 denotes a switch for selectively conducting and breaking the current of the source for the intermediate-order bits, 47 denotes a switch for selectively conducting and breaking the current of the source for the lower order bits, 48 denotes a counter for the upper order bits for controlling the siwtch 45, 49 denotes a counter for the intermediate-order bits for controlling the switch 46, 50 denotes a counter for the lower order bits for controlling the switch 47, 51 denotes an input terminal for the upper order bits of digital data, 52 denotes an input terminal for the intermediate-order bits of digital data, 53 denotes an input terminal for the lower order bits of digital data, 54 denotes an input terminal for a clock signal, 55 denotes a constant current source for supplying a constant current to the capacitor 8 in the direction opposite to that of the currents of the weighted current sources 42, 43 and 44, a numeral 56 denotes a switch for connecting and disconnecting the constant current source 55 for a predetermined constant period, and 57 denotes a control circuit for controlling the switches 9 and 56 and the counters 44, 49 and 50. In operation, simultaneously with the discharge of electric charge from the capacitor 8 by means of the switch 9, the input digital data are divided into the upper order bits, the intermediate-order bits and the lower order bits to be loaded in the associated counters 48, 49 and 50, respectively. Then, the constant current sources 42, 43 and 44 are connected to the integrator for periods corresponding to the contents placed in the associated counters 48, 49, 50, respectively, while a constant current is supplied from the source 55 to the integrator by way of the switch 56 for a predetermined constant period. As a result, there is produced at the output 10 of the integrator an analogue waveform having the center level lying substantially at the ground potential level. The D/A converter shown in FIG. 11 differs from the one shown in FIG. 9 merely in that the number of the current sources employed for integration of currents in dependence on the input digital data is changed to 3 from 2 in the case of the embodiment shown in FIG. 9. The principle of operation is same as the latter.

Figure 12:
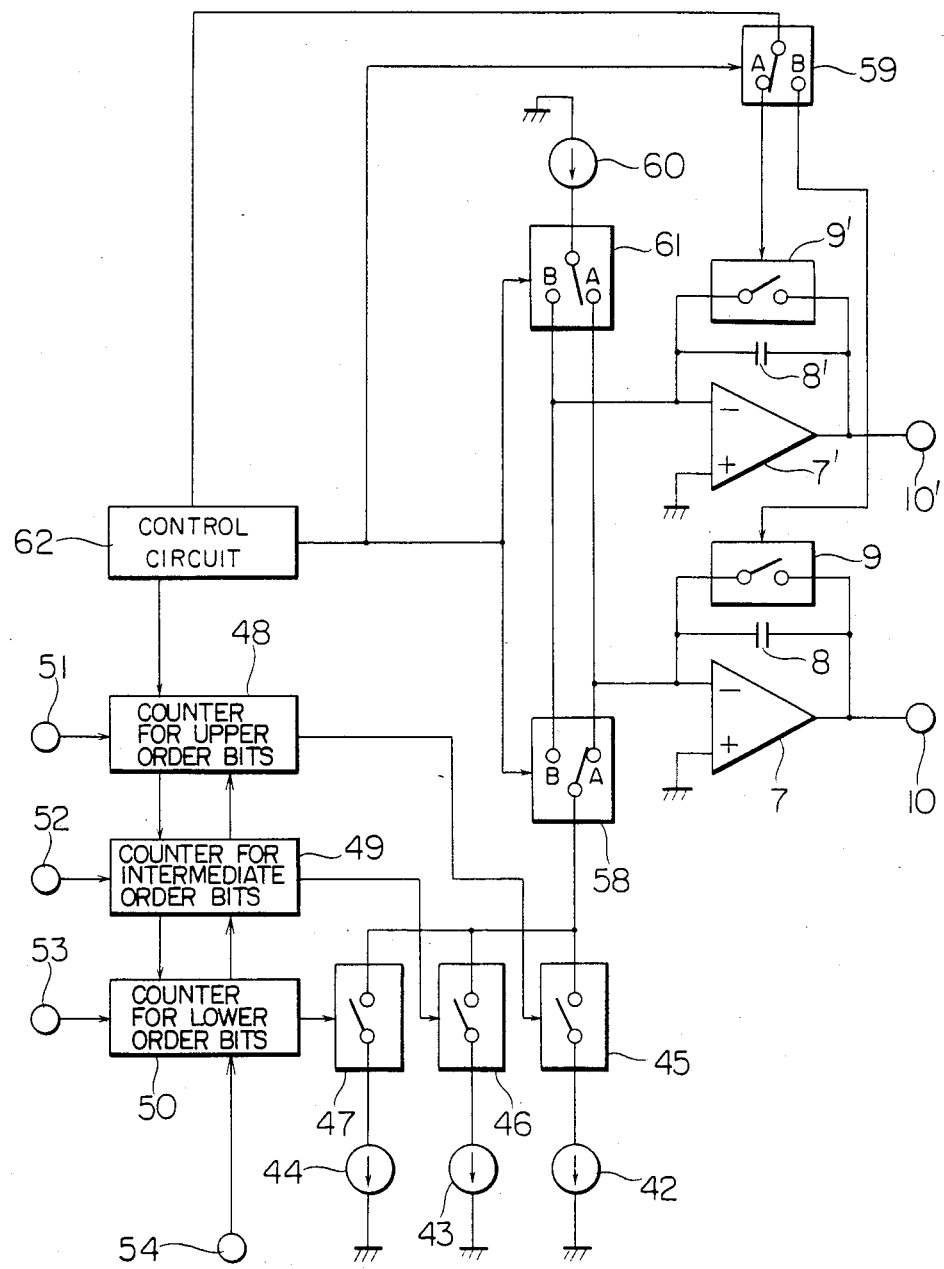
FIG. 12 is a circuit diagram showing a further embodiment of the invention.

FIG. 12 shows a still further embodiment of the invention applied to a system in which a plurality of data are sequentially recorded in a digital signal form such as a system in which audio signal is recorded stereophonically on a single track of a recording medium in such a manner that audio signal components of two channels, i.e. left and right channels, are recorded alternately with each other. In the case of the D/A converter shown in FIG. 12, it is assumed that two species or strings of data or information are recorded. Accordingly, there are provided two integrators, one of which is constituted by the elements 7, 8, 9 and 10 while the other is constituted by equivalent elements denoted by 7', 8', 9' and 10'. In FIG. 12, a reference numeral 58 denotes a switch for changing over the currents between the pair of integrators which currents are derived through the current switches 45, 46 and 47 adapted to be turned on for periods determined in dependence on the bit contents placed in the associated bit counters 48, 49 and 50, respectively, a numeral 59 denotes a switch for changing over the turn-on signal between the switches 9 and 9' of the two integrators, respectively, a numeral 60 denotes a constant current source for supplying a predetermined constant current in the direction opposite to that of the currents supplied from the constant current sources 42, 43 and 44 with reference to the capacitors 8 and 8', a numeral 61 denotes a switch for changing over the current from the constant current source 60 between the two integrators at a predetermined interval, and a numeral 62 denotes a control circuit for controlling the switches 9, 9', 58, 59 and 61 and the counters 48, 49 and 50.

When the sum of the reset period 22 and the output period 25 for transferring the output analogue signal of the integrator to a succeeding stage is set substantially equal to a period 44 (the period in which the currents from the constant current sources 11, 12 and 36 are integrated in the case of the D/A converter shown in FIG. 9 and the period in which the currents from the sources 42, 43, 44 and 55 or 60 are integrated in the case of the D/A converters shown in FIGS. 11 and 12), conversion of the two strings of digital information to analogue signals can be readily accomplished by using the pair of integrators.

Describing more in detail, the output of one integrator is transferred to the succeeding stage while the one digital data is integrated by means of the other integrator, which is followed by the discharging of electric charge stored in the capacitor provided in association with said one integrator. Next, the analogue data signal output of said other integrator is transferred to the succeeding stage with the electric charge of the associated capacitor being discharged, while integration based on the other digital data is performed by said one integrator.

With the circuit arrangement shown in FIG. 12, the periods allocated for processing two strings of data, respectively, can be selected long as compared with the case where the processing of two strings of information is performed by means of one integrator on the time-serial basis, whereby digital data can be converted to analogue signal with a high fidelity. In this connection, it is important to note that the constant current source 60 adapted for supplying the current in the opposite or reverse direction as described above by referring to FIG. 11 is electrically connected to the integrator which is active at that time, whereby the center level of the analogue signal output from the integrator can be set approximately at the ground potential level, bringing about same advantageous effect as in the case of the D/A converters shown in FIGS. 9 and 11. More specifically, under the control of the control circuit 62, the switches 58 and 61 are closed on respective contacts A during a half of a predetermined period, resulting in that the currents from the constant current sources 42, 43 and 44 flows to the capacitor 8 for periods determined in dependence on the digital bit data contained in the associated counters 48, 49 and 50, respectively, through the contact A of the switch 58, while at the same time a constant current flows from the constant current source 60 to the capacitor 8 through the contact A of the switch 61, whereby an analogue data signal is obtained at the output terminal 10 of the integrator (7, 8, 9). Since the switch 59 is closed on the contact A at that time, the switch 9 is opened without fail. During the next half period, the switches 58, 59 and 61 are closed on the respective contacts B to allow the analogue signal appearing at the output 10 to be transferred to the succeeding stage which is followed by the closing of the switch 9 in response to the signal supplied thereto from the control circuit 62 by way of the switch 59, to thereby cause electric charge stored in the capacitor 8 to be discharged.

At that time, the capacitor 8' is charged with the currents supplied from the constant current sources 60, 42, 43 and 44, resulting in that an analogue signal corresponding to the input digital data makes appearance at the output 10'.

As will now be appreciated, it is possible to make the center level of the analogue output waveform coincide at least approximately with the ground potential level by supplying the current of the constant current source 60 alternately to the integrators (7, 8, 9; 7', 8', 9') through the change-over switch 61, which in turn means that a digitally-recorded-signal reproducing apparatus can be realized without giving rise to reduction in the dynamic range.

Although integration in dependence on the digital data is effected by employing three current sources provided for the three different bit groups, respectively, of the digital data in the case of the D/A converter shown in FIG. 12, it goes without saying that similar effect can be attained with the arrangement where the two current sources are employed as in the case of the D/A converter shown in FIG. 9.

Figure 13:
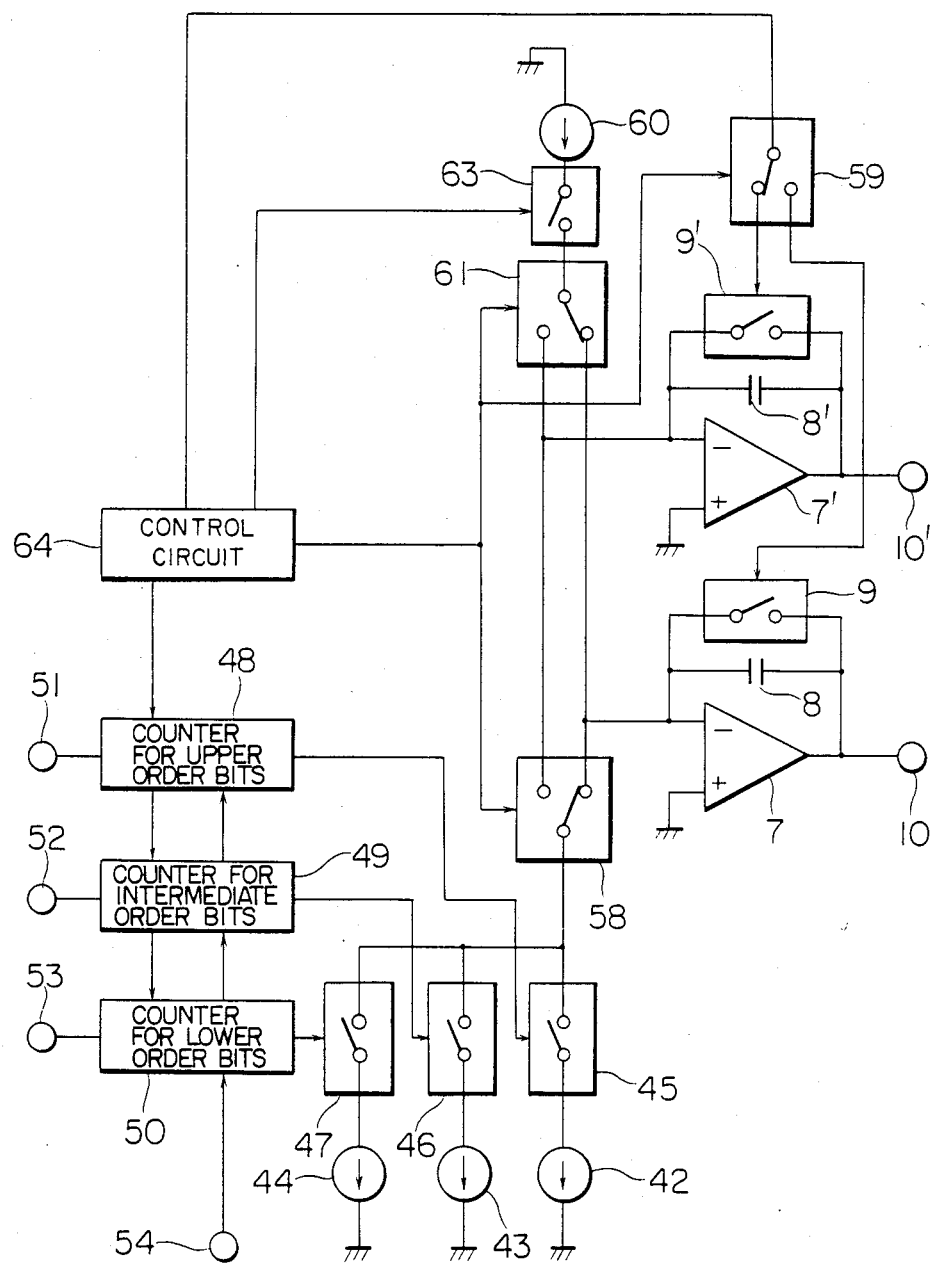
FIG. 13 is a circuit diagram showing a yet another embodiment of the invention.

A still further embodiment of the invention is shown in FIG. 13.

In the figure, a reference numeral 63 denotes a switch, and 64 denotes a control circuit. The D/A converter according to the instant embodiment is featured by additional provision of a switch 63 between the constant current source 60 and the switch 61 in the D/A converter shown in FIG. 12, to thereby make it possible to interrupt the current supply from the constant current source 60 or vary the equivalent current quantity (i.e. product of the current and time). More specifically, in the case of the D/A converters shown in FIGS. 11 to 13, the current values of the constant current sources 42, 43 and 44 have to be set at the ratio of 1024:32:1 with desired accuracy. In this connection, when the current values are to be measured to ascertain that desired accuracy is maintained, only the values of the currents supplied from the sources 42, 43 and 44 outputted by changing over the switches 45, 46 and 47 and added with the current value of the constant current source 60 can be measured in the case where the switches 58 and 61 are interlocked with each other. For accomplishing the measurement with a reasonable fidelity, it is necessary to open the switch 63.

Further, there arises no problem so far as the periodical changing-over of the switches 58, 59 and 61 remains in a predetermined constant relationship with the periodical input of the clock signal 54. In the case where this relation varies, the switch 63 may be turned off in correspondence with change in the relation to thereby make the center line of the analogue output waveform coincide with the ground potential level.

It is assumed, for example, that the switching frequency and the clock frequency are in such relation that the center level of the analogue output waveform is set at the ground potential level, and that the clock frequency is subsequently decreased by a half with the switching frequency remaining unchanged. Then, only the period during which integration is performed in dependence on the digital data is reduced by a half. As the consequence, the full-scale level of the analogue output lies in the vicinity of the ground potential level. To evade such undesirable situation, it is proposed to change over the switch 63 at a frequency twice as high as the switching frequency of the swtich 61 when the clock frequency is decreased by a half. Then, the period during which the current of the constant current source 60 flows through the switch 61 can be reduced by a half (which means in the sense of equivalence that the current value of the constant current source 60 is decreased by a half), allowing the center level of the analogue waveform outputted by the integrator to be set in the vicinity of the ground potential level.

As will be understood from the above description, it is possible to set the center level of the analogue output of the integrater at least approximately at the ground potential level by providing the additional current source which produces the current flowing to the capacitor of the integrator for a predetermined period in the direction opposite to that of the current generated by the constant current source or sources and integrated in dependence on the digital input data.

Figure 14:
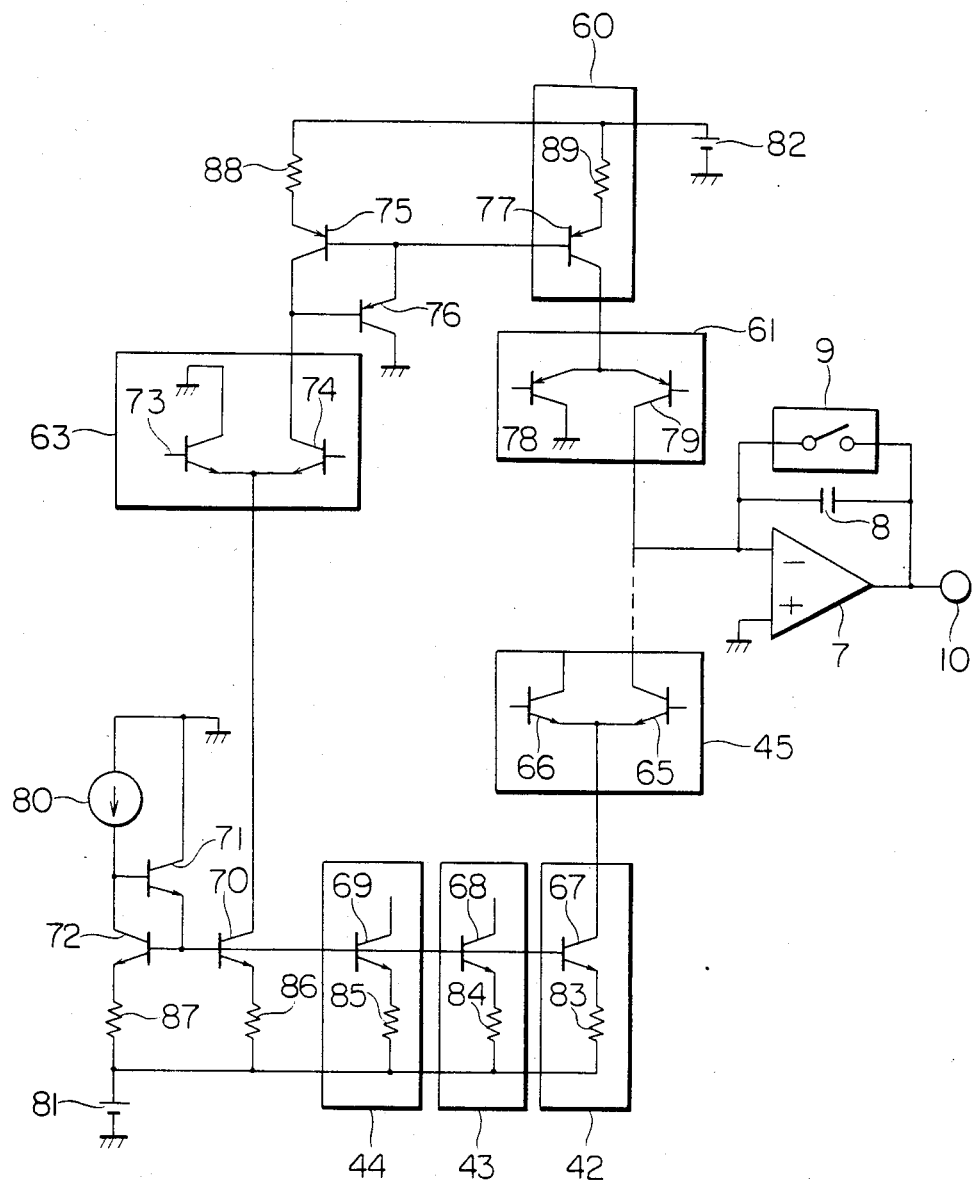
FIG. 14 is a circuit diagram showing a still further embodiment of the invention.

FIG. 14 shows in a circuit diagram a main portion of the D/A converter shown in FIG. 13. In FIG. 14, reference numerals 65 to 74 denotes NPN transistors, respectively, 75 to 79 denote PNP transistors, respectively, 80 denotes a constant current source, 81 and 82 denote voltage sources, respectively, and 83 to 89 denote resistors, respectively. The transistors 67 to 69 and the resistors 83 to 85 constitute, in cooperation with the constant current source 80, the transistors 71 and 72 and the resistor 87, current mirror circuits which serve as the constant current sources 42, 43 and 44, respectively, while the transistors 65 and 66 constitute the switch 45. For protecting the constant current source 60 from adverse influences such as temperature drift, a constant current source is constituted by the transistor 70 having a base connected to the base of the transistor 72 and the resistor 86 so that the collector current of the transistor 70 exhibits the same temperature characteristic as the currents of the constant current sources 42, 43 and 44, and on the basis of the collector current of the transistor 70, the current mirror circuit 60 constituted by the transistors 75, 76 and 77 and the resistors 88 and 89, produces a constant current from the collector of the transistor 77 exhibiting the same temperature characteristic as the collector current of the transistor 70. Although the switch 63 constituted by the transistors 73 and 74 is interposed between the current mirror circuit constituted by the transistors 75, 76 and 77 and the resistor 88 and 89 and the transistor 70, it is also possible to constitute the switch 63 by PNP transistor switch similar to the switch constituted by the transistors 78 and 79 and dispose the switch 63 between the transistor 77 and the switch 61.

As will be appreciated from the foregoing description, the present invention has provided integration-type D/A converters which enjoy increased design leeway because of absence of the instantaneous charging in the reset period and in which the center level of the analogue signal output from the integrator can be set at least approximately at the ground potential level, whereby a digitally-recorded-signal reproducing apparatus having an increased dynamic range can be realized.

Although the invention has been described in conjunction with exemplary embodiments which are presently believed to be preferable, it will be readily appreciated that modifications and variations will occur readily to those skilled in the art in light of the disclosure without departing from the spirit and scope of the invention as defined in the claims.

We claim:

1. A digital-to-analogue converter for converting a digital signal to an analogue signal, comprising:
   integrating means for integrating an input current thereto and outputting an analogue signal representative of the result obtained through integration of said input currents;
   first constant current generating means for supplying a first predetermined constant current to said integrating means in a first predetermined direction;
   first switch means for controlling the period during which said first predetermined current is supplied to said integrating means;
   second constant current generating means including a second constant current source for supplying a second predetermined constant current to said integrating means in a second direction opposite to said first predetermined direction, said input current corresponding to a sum of said first and second predetermined constant currents;
   second switch means for controlling the period during which said second predetermined constant current is supplied to said integrating means;
   first switch controlling means for responding to the digital signal to make said first switch means conductive during a period corresponding to said digital signal; and
   second switch controlling means for controlling said second switch means.

2. A digital-to-analogue converter according to claim 1, wherein said integrating means includes a predetermined number of integrators, said second switch means including third switch means for supplying a current corresponding to the sum of said first and second predetermined constant currents to said predetermined number of the integrators alternately, said second switch control means including means for changing over said third switch means in dependence on information species carried by said digital signal, the number of said information species being equal to the number of said integrators.

3. A digital-to-analogue converter according to claim 2, further including fourth switch means disposed between said second constant current source and said third switch for controlling supply and breaking of said second predetermined constant current, said second switch control means including means for controlling said third switch means and said fourth switch means independently from each other.

4. A digital-to-analogue converter according to claim 3, wherein said digital-to-analogue converter is employed in a digitally-recorded-signal reproducing apparatus for reproducing a signal recorded in a digital form in which information signal is converted to a digital signal to be recorded on a recording medium such as disk, tape or the like by optical or magnetic means, the digital signal read out from said recording medium by optical or magnetic means or digital signal carried by transmitting means such as electromagnetic wave being received to be restored to an analogue signal through digital-to-analogue conversion after processing of the digital signal for error detection and correction.

5. A digital-to-analogue converter according to claim 1, wherein said first constant current generating means includes N constant current sources, a sum of the currents produced by said N constant current sources constituting said first predetermined constant current;

said first switch means including N switches each of which controls a period during which the constant current generated by associated one of said N constant current sources is supplied to said integrating means;

said first switch control means including N counters each of which closes associated one of said N switches when an associated one of N bit-groups into which said digital signal is divided is placed in said counter, for a period corresponding to the digital data represented by said one bit-group.

6. A digital-to-analogue converter according to claim 1, wherein said integrating means includes an operational amplifier, a capacitor connected between an inverting input terminal and output terminal of said operational amplifier and a reset switch connected in parallel with said capacitor, said operational amplifier having a non-inverting input terminal supplied with potential of a reference level, said reset switch being controlled by said second switch control circuit for discharging electric charge from said capacitor during a reset period in the initial phase of each digital-to-analgoue conversion cycle, said first switch control circuit including a counter which closes said first switch means when said digital signal is loaded in said counter for a period corresponding to said digital signal starting from the end of said reset period, said second switch means being closed under the control of said second switch control circuit for a predetermined period starting from the end of said reset period, said operational amplifier generating at the output thereof said analogue signal corresponding to a voltage produced at said capacitor by the sum of said first and second predetermined currents.

7. A digital-to-analogue converter according to claim 1, wherein said integrating means includes an operational amplifier, a capacitor connected between an inverting input terminal and output terminal of said operational amplifier and a reset switch connected in parallel with said capacitor, said operational amplifier having a non-inverting input terminal supplied with potential of a reference level, said reset switch being controlled by said second switch control circuit for discharging electric charge from said capacitor during a reset period in the initial phase of each digital-to-analogue conversion cycle;

said first constant current generating means including N constant current sources, said first predetermined constant current being constituted by the sum of currents generated by said N constant current sources, said first switch means including N switches each of which controls the period during which the constant current is supplied from the associated constant current source to said integrating means;

said first switch control means including N counters each of which closes the associated one of said N switches when an associated one of bit groups into which bits constituting said digital signal are divided is placed in said counter, for a period corresponding to the digital data represented by said one bit-group starting from the end of said reset period, said second switch means being closed under the control of said second switch control circuit for a predetermined period starting from the end of said reset period, said operational amplifier generating at the output thereof said analogue signal corresponding to the voltage produced at said capacitor by the sum of said first and second predetermined constant currents.

* * * * *